US011258155B2

(12) United States Patent
Matsushita et al.

(10) Patent No.: US 11,258,155 B2
(45) Date of Patent: Feb. 22, 2022

(54) MULTILAYER ELECTRONIC COMPONENT

(71) Applicant: Murata Manufacturing Co., Ltd., Kyoto (JP)

(72) Inventors: Yosuke Matsushita, Kyoto (JP); Ryota Asai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/682,510

(22) Filed: Nov. 13, 2019

(65) Prior Publication Data

US 2020/0083587 A1 Mar. 12, 2020

Related U.S. Application Data

(63) Continuation of application No. PCT/JP2018/019092, filed on May 17, 2018.

(30) Foreign Application Priority Data

May 19, 2017 (JP) ............................ JP2017-099959

(51) Int. Cl.
*H01F 27/28* (2006.01)
*H01P 5/18* (2006.01)
(Continued)

(52) U.S. Cl.
CPC ......... *H01P 5/184* (2013.01); *H01F 27/2804* (2013.01); *H01F 27/292* (2013.01);
(Continued)

(58) Field of Classification Search
CPC .... H01P 5/184; H01P 11/003; H01F 27/2804; H01F 27/292; H01F 41/043; H01F 2027/2809
See application file for complete search history.

(56) References Cited

U.S. PATENT DOCUMENTS 5,032,803 A 7/1991 Koch
5,041,899 A * 8/1991 Oku .................. H01L 23/49833
257/693
(Continued)

FOREIGN PATENT DOCUMENTS

JP H05-83015 A 4/1993
JP H08-78915 A 3/1996
(Continued)

OTHER PUBLICATIONS

International Search Report for International Application No. PCT/JP2018/019092 dated Aug. 7, 2018.
(Continued)

*Primary Examiner* — Dinh T Le
(74) *Attorney, Agent, or Firm* — Pearne & Gordon LLP

(57) ABSTRACT

A multilayer electronic component includes an element body including a plurality of base layers stacked in a first direction, an inner conductor disposed in the element body, and a mounting terminal connected to the inner conductor. The multilayer electronic component has a mount surface positioned on a mounted side when the multilayer electronic component is mounted. The mount surface is disposed so as not to intersect an axis along the first direction. The mounting terminal is disposed on the mount surface and embedded from the mount surface into the element body.

19 Claims, 10 Drawing Sheets

(51) Int. Cl.
*H01F 27/29* (2006.01)
*H01F 41/04* (2006.01)
*H01P 11/00* (2006.01)

(52) U.S. Cl.
CPC .......... *H01F 41/043* (2013.01); *H01P 11/003* (2013.01); *H01F 2027/2809* (2013.01)

(56) References Cited

U.S. PATENT DOCUMENTS

| | | | | |
|---|---|---|---|---|
| 8,201,319 | B2 * | 6/2012 | Lee | G11B 5/6005 29/603.12 |
| 9,119,318 | B2 * | 8/2015 | Kogure | H05K 1/165 |
| 10,002,710 | B2 * | 6/2018 | Kitajima | H01F 17/0013 |
| 10,269,482 | B2 * | 4/2019 | Yoneda | H01F 27/292 |
| 2002/0057174 | A1 * | 5/2002 | Uchikoba | H01F 17/0013 336/200 |
| 2014/0202750 | A1 * | 7/2014 | Kogure | H05K 1/165 174/260 |
| 2016/0141102 | A1 * | 5/2016 | Tseng | H01F 27/292 336/192 |
| 2016/0372261 | A1 | 12/2016 | Ozawa | |
| 2017/0018351 | A1 | 1/2017 | Yatabe et al. | |
| 2017/0077578 | A1 | 3/2017 | Baba et al. | |

FOREIGN PATENT DOCUMENTS

| | | | |
|---|---|---|---|
| JP | 2012-049696 | A | 3/2012 |
| JP | 2017-011044 | A | 1/2017 |
| JP | 2017-022304 | A | 1/2017 |
| WO | 2015/186538 | A1 | 12/2015 |

OTHER PUBLICATIONS

Written Opinion for International Application No. PCT/JP2018/019092 dated Aug. 7, 2018.

* cited by examiner

MULTILAYER ELECTRONIC COMPONENT

This is a continuation of International Application No. PCT/JP2018/019092 filed on May 17, 2018 which claims priority from Japanese Patent Application No. 2017-099959 filed on May 19, 2017. The contents of these applications are incorporated herein by reference in their entireties.

BACKGROUND

Technical Field

The present disclosure relates to a multilayer electronic component including a mounting terminal.

As a multilayer electronic component formed by stacking a plurality of base layers, a multilayer electronic component has been conventionally known which includes an element body including a plurality of base layers, an inner conductor disposed in the element body, and a mounting terminal connected to the inner conductor (see, e.g., Patent Document 1). In the multilayer electronic component disclosed in Patent Document 1, the mounting terminal is formed on the surface of the element body.

Patent Document 1: Japanese Unexamined Patent Application Publication No. 2012-49696

BRIEF SUMMARY

In such a conventional multilayer electronic component, the mounting terminal may fall off the element body due to a low securing strength between the element body and the mounting terminal.

Accordingly, the present disclosure provides a multilayer electronic component in which the securing strength between the element body and the mounting terminal can be improved.

A multilayer electronic component according to an aspect of the present disclosure includes an element body including a plurality of base layers stacked in a first direction, an inner conductor disposed in the element body, and a mounting terminal connected to the inner conductor. The multilayer electronic component has a mount surface positioned on a mounted side when the multilayer electronic component is mounted. The mount surface is disposed so as not to intersect an axis along the first direction. The mounting terminal is disposed on the mount surface and embedded from the mount surface into the element body.

With this configuration, where the mount surface is formed so as not to intersect the axis along the first direction, which is the stacking direction of the plurality of base layers, and the mounting terminal is disposed to be embedded from the mount surface into the element body, it is possible to enhance the securing strength between the element body and the mounting terminal.

The mount surface may be parallel to the axis along the first direction.

With this configuration, where the mount surface is formed parallel to the axis along the first direction, which is the stacking direction of the plurality of base layers, and the mounting terminal is disposed to be embedded from the mount surface into the element body, it is possible to enhance the securing strength between the element body and the mounting terminal.

The mounting terminal may be embedded in a direction perpendicular to the mount surface.

With this configuration, where the mounting terminal is embedded into the element body in a direction perpendicular to the mount surface, it is possible to enhance the securing strength between the element body and the mounting terminal.

The mounting terminal may be exposed from the element body.

With this configuration, for example, when the multilayer electronic component is mounted on a mount substrate, a portion of the mounting terminal exposed from the element body can be joined to the mount substrate. This can improve the connection strength between the multilayer electronic component and the mount substrate.

The mounting terminal may be formed by interlayer conductors disposed in respective at least three adjacent ones of the plurality of base layers.

With this configuration, since the dimension of the mounting terminal in the first direction can be determined by the thickness dimension of the base layers, the dimensional accuracy of the mounting terminal in the first direction can be improved. Thus, for example, when a plurality of mounting terminals are disposed on the mount surface, the mounting terminals can be arranged with a small pitch.

The mounting terminal may be in the shape of a rectangular parallelepiped.

This can prevent the mounting terminal from easily falling off the element body, and can enhance the securing strength between the element body and the mounting terminal.

The multilayer electronic component may be in the shape of a rectangular parallelepiped and may include a plurality of mounting terminals. The plurality of mounting terminals may be disposed on the same mount surface.

With this configuration, for example, the multilayer electronic component can be stably mounted on the mount substrate.

The multilayer electronic component may be in the shape of a rectangular parallelepiped and may have a side face perpendicular to the mount surface. The multilayer electronic component may further include a side terminal disposed on the side face and connected to the mounting terminal.

With this configuration, for example, when the multilayer electronic component is mounted on a mount substrate, the side terminal can be used to solder the multilayer electronic component to the mount substrate. This can improve the connection strength between the multilayer electronic component and the mount substrate.

The multilayer electronic component may be a directional coupler. The inner conductor may include a main line and a secondary line. The mounting terminal may include a pair of first mounting terminals connected to respective ends of the main line, and a pair of second mounting terminals connected to respective ends of the secondary line.

With this configuration, in the multilayer electronic component which is a directional coupler, the securing strength between the element body and the mounting terminal can be enhanced.

The present disclosure can enhance the securing strength between the element body and the mounting terminal in the multilayer electronic component.

DETAILED DESCRIPTION

Figure 1:
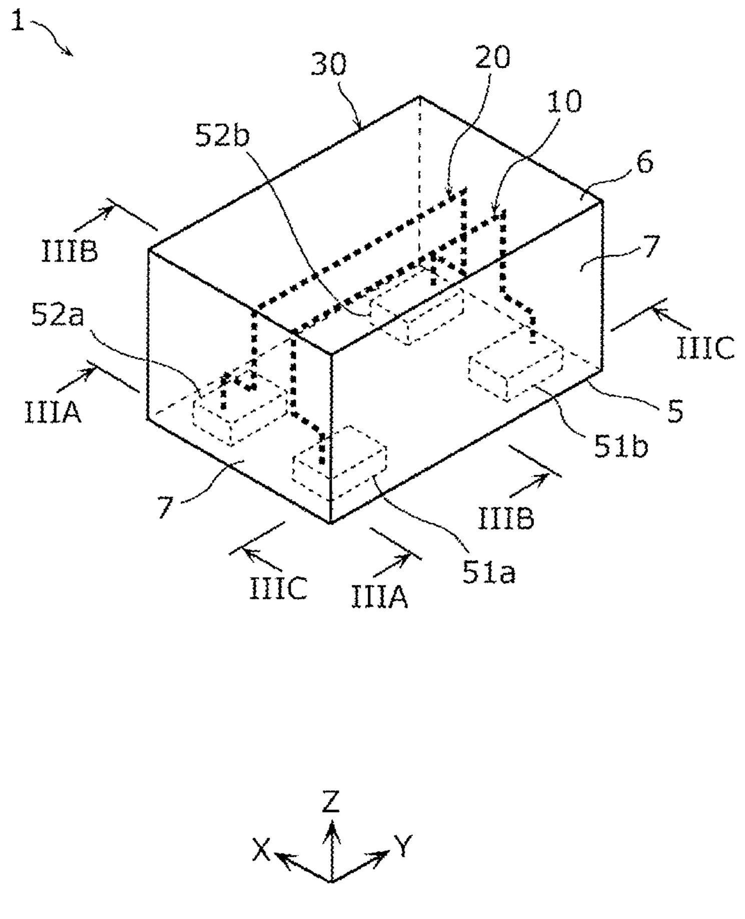
FIG. 1 is a perspective view of a multilayer electronic component according to a first embodiment.

Embodiments of the present disclosure will now be described in detail using the drawings. The embodiments described herein represent either general or specific examples. Numerical values, shapes, materials, component elements, arrangements and modes of connection of the component elements, manufacturing steps, the order of the manufacturing steps, and other features presented in the embodiments are merely examples and are not intended to limit the scope of the present disclosure. Of the component elements in the following embodiments, those not defined in the independent claims will be described as being optional.

Note that the drawings are schematic and are not necessarily exactly to scale. In the drawings, substantially the same components are denoted by the same reference numerals and redundant description will be omitted or simplified.

First Embodiment

[1-1. Configuration of Multilayer Electronic Component]

A multilayer electronic component according to the present embodiment is a ceramic electronic component that includes an element body including a plurality of base layers stacked, an inner conductor disposed in the element body, and a mounting terminal connected to the inner conductor. Examples of the multilayer electronic component include a directional coupler, an inductor, and a dual inductor, such as a common mode choke coil, a transformer, or a balun. In the present embodiment, a directional coupler will be described as an example of the multilayer electronic component.

Figure 2:
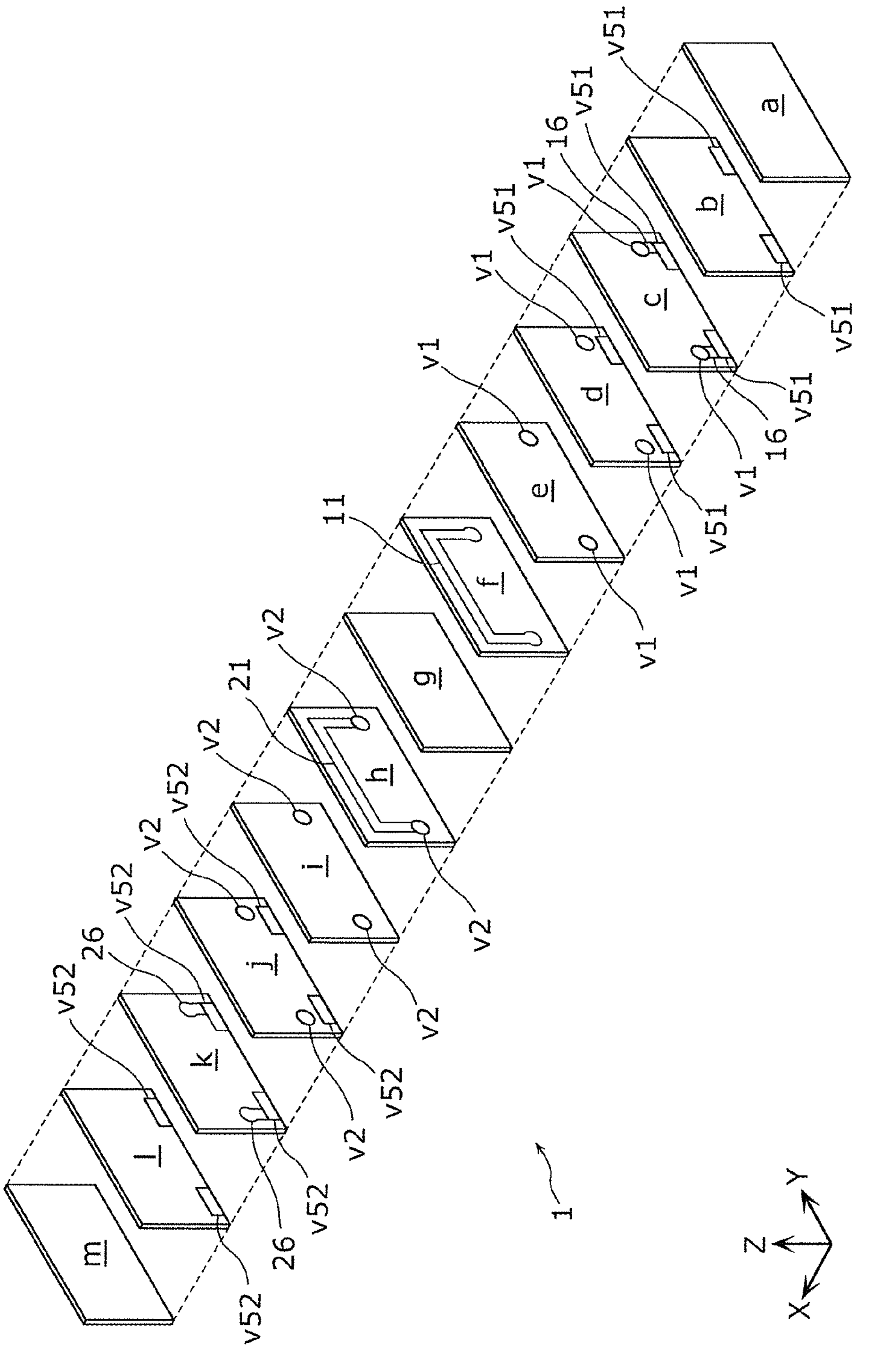
FIG. 2 is an exploded perspective view of the multilayer electronic component according to the first embodiment.
Figure 3A:
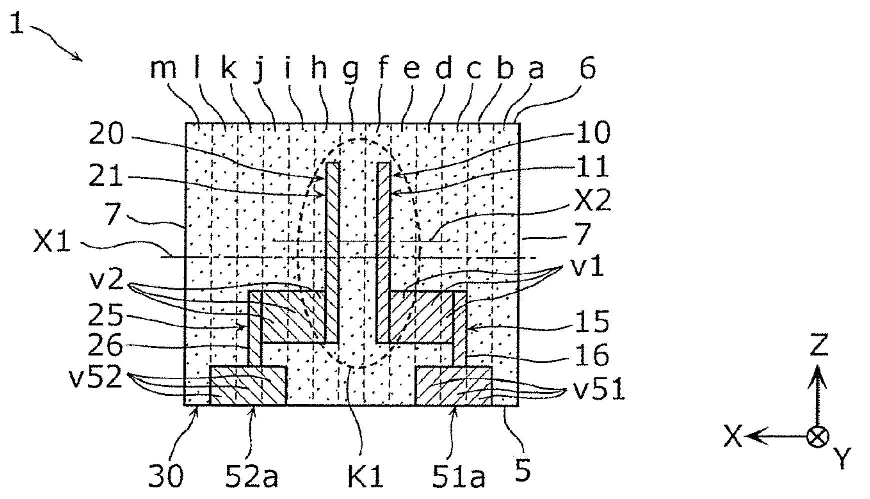
FIG. 3A is a cross-sectional view of the multilayer electronic component according to the first embodiment, taken along line IIIA-IIIA of FIG. 1.
Figure 3B:
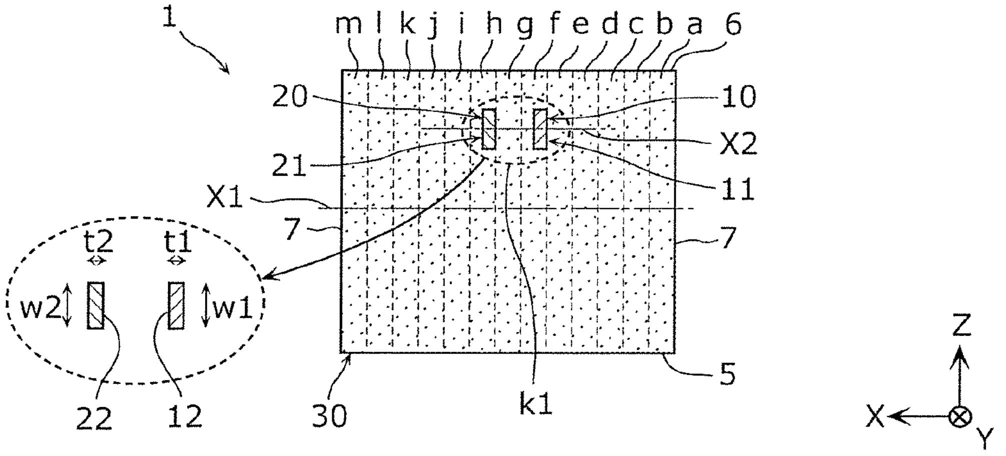
FIG. 3B is a cross-sectional view of the multilayer electronic component according to the first embodiment, taken along line IIIB-IIIB of FIG. 1.
Figure 3C:
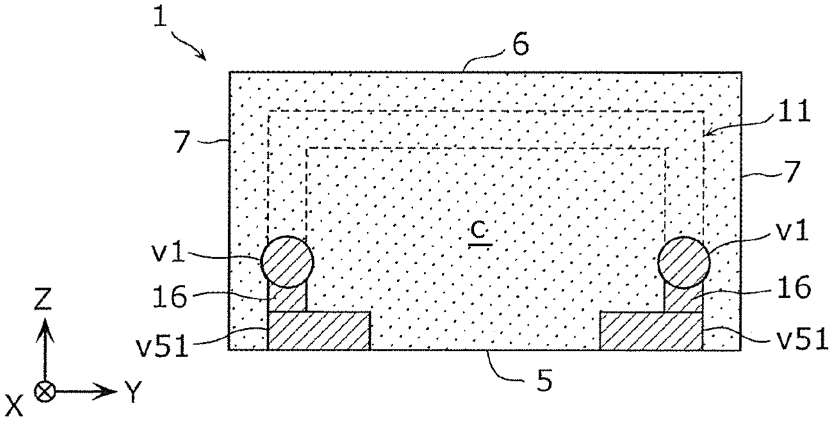
FIG. 3C is a cross-sectional view of the multilayer electronic component according to the first embodiment, taken along line IIIC-IIIC of FIG. 1.

A configuration of a multilayer electronic component 1 will be described with reference to FIG. 1 to FIG. 3C. FIG. 1 is a perspective view of the multilayer electronic component 1 according to the present embodiment. FIG. 2 is an exploded perspective view of the multilayer electronic component 1. FIG. 3A is a cross-sectional view of the multilayer electronic component 1 taken along line IIIA-IIIA of FIG. 1. FIG. 3B is a cross-sectional view of the multilayer electronic component 1 taken along line IIIB-IIIB of FIG. 1. FIG. 3C is a cross-sectional view of the multilayer electronic component 1 taken along line IIIC-IIIC of FIG. 1.

As illustrated in FIG. 1 to FIG. 3C, the multilayer electronic component 1 includes an element body 30 having insulating properties, two inner conductors 9 both disposed in the element body 30 and having conductive properties, a pair of first mounting terminals 51*a* and 51*b* having conductive properties, and a pair of second mounting terminals 52*a* and 52*b* having conductive properties. Of the two inner conductors 9, one inner conductor 9 is a main line 10 of the directional coupler and the other inner conductor 9 is a secondary line 20 of the directional coupler.

The multilayer electronic component 1 is rectangular parallelepiped-like in outer shape and has a mount surface 5, a top surface 6 opposite the mount surface 5, and four side faces 7 perpendicular to both the mount surface 5 and the top surface 6. The mount surface 5 is a surface positioned on the mounted side when the multilayer electronic component 1 is mounted on a mount substrate. In other words, when the multilayer electronic component 1 is mounted, the mount surface 5 faces a principal surface of the mount substrate.

The element body 30 is formed, for example, by stacking a plurality of base layers a, b, c, d, e, f, g, h, i, j, k, 1, and m. The plurality of base layers a to m are each formed, for example, using a dielectric material. The base layers a and m are outermost layers, each serving as an outer coating.

The stacking direction in which the plurality of base layers a to m are stacked is defined as a first direction X, the direction in which the mount surface 5 and the top surface 6 face each other is defined as a third direction Z, and the direction perpendicular to both the first direction X and the third direction Z is defined as a second direction Y. The mount surface 5 described above is perpendicular to an axis along the third direction Z. The mount surface 5 is disposed so as not to intersect an axis X1 along the first direction X, and is parallel to the axis X1 along the first direction X.

The mount surface 5 has the pair of first mounting terminals 51*a* and 51*b* and the pair of second mounting terminals 52*a* and 52*b*. The first mounting terminals 51*a* and 51*b* are connected to respective ends of the main line 10. The second mounting terminals 52*a* and 52*b* are connected to respective ends of the secondary line 20. Hereinafter, the first mounting terminals 51*a* and 51*b* may be collectively referred to as mounting terminals 51, and the second mounting terminals 52*a* and 52*b* may be collectively referred to as mounting terminals 52.

The mounting terminals 51 and the mounting terminals 52 are arranged in a land grid array (LGA) on the mount surface 5. The mounting terminals 51 and 52 have respective exposed surfaces exposed from the element body 30. The exposed surfaces are formed in the same plane as the mount surface 5.

The mounting terminals 51 and 52 are each rectangular parallelepiped-like in outer shape. In other words, the mounting terminals 51 and 52 are each rectangular in cross-section taken along a plane perpendicular to the mount surface 5.

The first mounting terminals 51*a* and 51*b* are each formed by stacking interlayer conductors v51 in the three adjacent base layers b, c, and d of the plurality of base layers a to m in the stacking direction (see FIG. 2). The second mounting terminals 52*a* and 52*b* are each formed by stacking interlayer conductors v52 in the three adjacent base layers j, k, and 1 in the stacking direction.

Figure 3D:
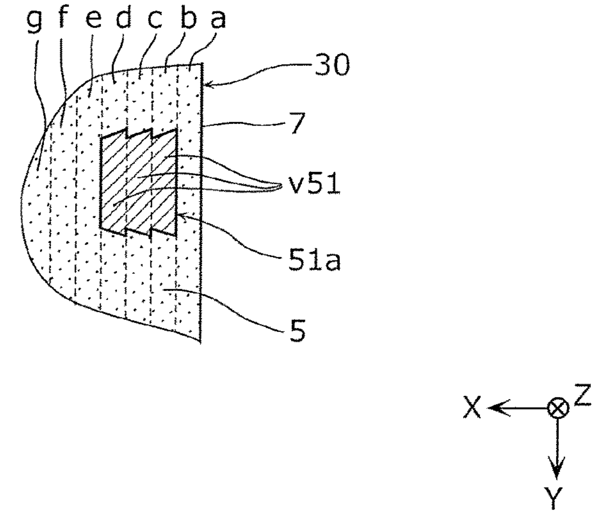
FIG. 3D is a diagram illustrating a first mounting terminal of the multilayer electronic component according to the first embodiment, as viewed from a mount surface.

FIG. 3D is a diagram illustrating the first mounting terminal 51*a* of the multilayer electronic component 1 as viewed from the mount surface 5. Specifically, the first mounting terminal 51*a*, which is rectangular parallelepiped-like in outer shape, is formed by stacking in the first direction X a plurality of interlayer conductors v51 that are trapezoidal in cross-section. Being rectangular parallelepiped-like does not necessarily need to mean being in the shape of a perfect rectangular parallelepiped, and the rectangular parallelepiped may be partially tapered. A surface of the first mounting terminal 51*a* in contact with base layers (e.g., a side face of the first mounting terminal 51*a*) may have triangular wave-like indentations. The first mounting terminal 51*b* and the second mounting terminals 52*a* and 52*b* have the same shape as the first mounting terminal 51*a*.

In the present embodiment, the mount surface 5 is formed parallel to the axis X1 along the first direction X, which is the stacking direction of the base layers a to m, and the mounting terminals 51 and 52 are embedded from the mount surface 5 into the element body 30 in the direction perpendicular to the mount surface 5 (third direction Z). Thus, the multilayer electronic component 1 has a structure in which the mounting terminals 51 and 52 are embedded in the element body 30, and this enhances the securing strength between the element body 30 and the mounting terminals 51 and 52.

The main line 10 and the secondary line 20, which are component elements of the directional coupler, will now be described.

The main line 10 has a first line portion 11 and a pair of extended line portions 15 connected to respective ends of the first line portion 11 (see FIG. 3A). The extended line portions 15 are each formed by stacking an extended pattern 16 on the base layer c (see FIG. 3C) and interlayer conductors v1 in the respective base layers c, d, and e in the stacking direction (see FIG. 2). The extended line portions 15 are each connected at one end thereof to the first line portion 11 and connected at the other end thereof to the first mounting terminal 51*a* or 51*b*. The first line portion 11 is an inverted U-shaped conductor pattern formed on the base layer f.

An electric signal is transmitted to the first line portion 11 through the first mounting terminals 51*a* and 51*b* and the pair of extended line portions 15. A line thickness t1 of the first line portion 11 is smaller in size than a line width w1 of the first line portion 11 (see FIG. 3B). The first line portion 11 is disposed in such a manner that an axis X2 along the line thickness direction does not intersect the mount surface 5. Specifically, the axis X2 along the line thickness direction of the first line portion 11 is parallel to the mount surface 5. The line thickness direction of the first line portion 11 is the same as the stacking direction of the plurality of base layers a to m (first direction X). The first line portion 11 has a line surface 12 perpendicular to the line thickness direction. The line surface 12 of the first line portion 11 is perpendicular to the mount surface 5.

The secondary line 20 has a second line portion 21 and a pair of extended line portions 25 connected to respective ends of the second line portion 21 (see FIG. 3A). The extended line portions 25 are each formed by stacking interlayer conductors v2 in the respective base layers h, i, and j and an extended pattern 26 on the base layer k in the stacking direction (see FIG. 2). The extended line portions 25 are each connected at one end thereof to the second line portion 21 and connected at the other end thereof to the second mounting terminal 52*a* or 52*b*. The second line portion 21 is formed on the base layer h. The shape of the conductor pattern of the second line portion 21 is the same as the shape of the conductor pattern of the first line portion 11.

A line thickness t2 of the second line portion 21 is smaller in size than a line width w2 of the second line portion 21 (see FIG. 3B). The second line portion 21 is disposed in such a manner that the axis X2 along the line thickness direction does not intersect the mount surface 5. Specifically, the axis X2 along the line thickness direction of the second line portion 21 is parallel to the mount surface 5. The line thickness direction of the second line portion 21 is the same as the stacking direction of the plurality of base layers a to m (first direction X).

The second line portion 21 and the first line portion 11 are arranged adjacent to each other, with the base layer g interposed therebetween, in the stacking direction of the base layers a to m (i.e., in the line thickness direction of the first line portion 11). The second line portion 21 has a line surface 22 perpendicular to the line thickness direction. The line surface 22 of the second line portion 21 is perpendicular to the mount surface 5 and faces the line surface 12 of the first line portion 11.

The second line portion 21 having the structure described above is electromagnetically coupled to the first line portion 11. Being "electromagnetically coupled" means being "capacitively coupled" and "magnetically coupled" at the same time. That is, the first line portion 11 and the second line portion 21 are capacitively coupled by capacitance formed therebetween, and are magnetically coupled by mutual inductance therebetween. FIG. 3A and FIG. 3B illustrate a coupling region K1 (encircled with a broken line) where the first line portion 11 and the second line portion 21 are electromagnetically coupled. In the multilayer electronic component 1, the electromagnetic coupling of the first line portion 11 and the second line portion 21 enables a signal corresponding to the electric signal transmitted to the first line portion 11, to be transmitted to the second line portion 21.

[1-2. Configuration of Radio-Frequency Module Including Multilayer Electronic Component]

Figure 4:
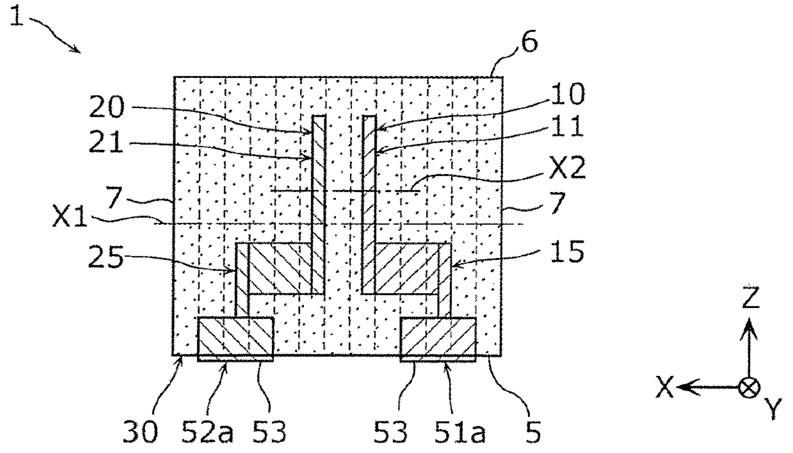
FIG. 4 is a cross-sectional view of the multilayer electronic component according to the first embodiment, illustrating mounting terminals, each having a plating layer thereon.
Figure 5:
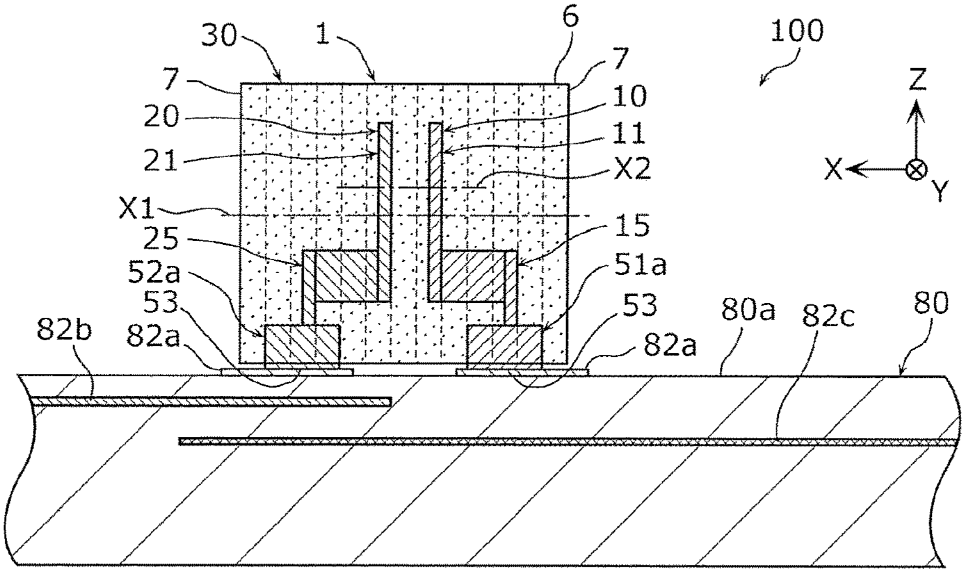
FIG. 5 is a cross-sectional view of a radio-frequency module with the multilayer electronic component of the first embodiment mounted therein.

Next, with reference to FIG. 4 and FIG. 5, a configuration of a radio-frequency module 100 including the multilayer electronic component 1 and advantageous effects of the multilayer electronic component 1 will be described. FIG. 4 is a cross-sectional view of the multilayer electronic component 1 according to the present embodiment, illustrating the mounting terminals, each having a plating layer 53 thereon. FIG. 5 is a cross-sectional view of the radio-frequency module 100 with the multilayer electronic component 1 mounted therein.

As illustrated in FIG. 4, the mounting terminals 51 and 52 of the multilayer electronic component 1, each have the plating layer 53. The plating layer 53 is formed using such materials as Ni and Sn. The plating layer 53 is formed to slightly protrude outward from the mount surface 5 by a distance as small as, for example, 10 μm or more and 100 μm or less.

As illustrated in FIG. 5, the radio-frequency module 100 includes the multilayer electronic component 1 and a mount substrate 80 having the multilayer electronic component 1 mounted thereon.

The mount substrate 80 has, for example, substrate electrodes 82*a*, 82*b*, and 82*c* disposed parallel to a principal surface 80*a* of the mount substrate 80. The substrate electrodes 82*a* are land electrodes formed on the principal surface 80*a* of the mount substrate 80. The substrate electrode 82*b* is a signal-transmitting electrode formed inside the mount substrate 80, and the substrate electrode 82*c* is a ground electrode formed inside the mount substrate 80.

The multilayer electronic component 1 is mounted, for example, by soldering onto the mount substrate 80 in such a manner that the mount surface 5 of the multilayer electronic component 1 is parallel to the substrate electrode 82*a*, 82*b*, or 82*c*.

In the multilayer electronic component 1 of the present embodiment, where the mounting terminals 51 and 52 are embedded from the mount surface 5 into the element body 30, the element body 30 and the mounting terminals 51 and 52 are secured with a high securing strength. Therefore, for example, even if external force or thermal stress is applied to the multilayer electronic component 1 or to the mount substrate 80, it is possible to prevent separation of the element body 30 and the mounting terminals 51 and 52.

[1-3. Method for Manufacturing Multilayer Electronic Component]

Figure 6:
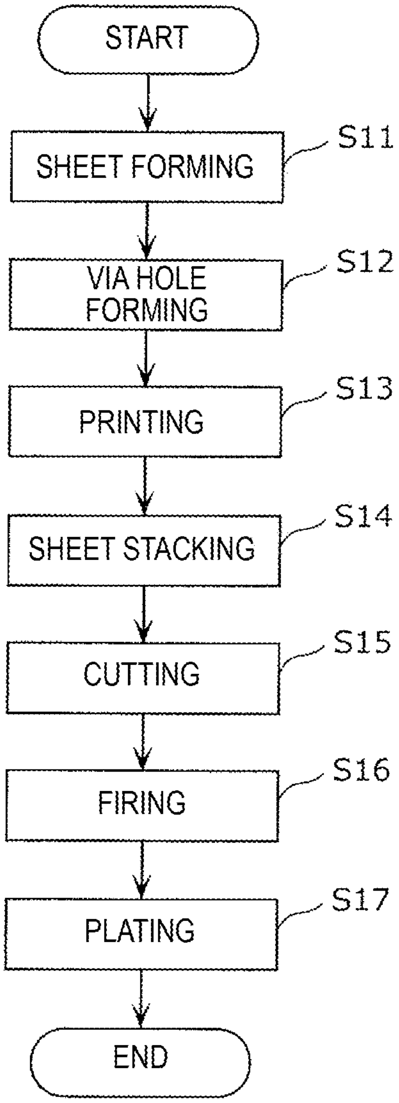
FIG. 6 is a flowchart illustrating a manufacturing method for manufacturing the multilayer electronic component according to the first embodiment.

A method for manufacturing the multilayer electronic component 1 will now be described with reference to FIG. 6 and FIG. 7. FIG. 6 is a flowchart illustrating a manufacturing method for manufacturing the multilayer electronic component 1.

First, a slurry containing ceramic powder, binder, and plasticizer is prepared and applied onto a carrier film to form a sheet (S11: sheet forming step). A plurality of ceramic green sheets to serve as the base layers a to m are thus produced. The ceramic green sheets have a thickness of, for example, 5 μm or more and 100 μm or less. Examples of a device used to apply the slurry include a lip coater and a blade coater.

Next, via holes are formed in the ceramic green sheets (S12: via hole forming step). Through holes for forming the interlayer conductors v1, v2, v51, and v52 in corresponding ones of the ceramic green sheets are thus made. Examples of a device used to form the via holes include a punching machine and a laser beam machine. To form holes for the interlayer conductors v51 and v52 that are rectangular in shape, a rectangular punch or a rectangular mask may be used to form rectangular through holes.

Next, the ceramic green sheets are printed with a conductive paste (S13: printing step). By this printing operation, the via holes are filled with the conductive paste and the interlayer conductors v1, v2, v51, and v52 are formed in corresponding ones of the ceramic green sheets. By this printing operation, conductor patterns, such as the first line portion 11, the second line portion 21, and the extended patterns 16 and 26, are also formed on corresponding ones of the ceramic green sheets. The conductive paste contains such materials as conductive powder (e.g., Cu powder), binder, and plasticizer. Examples of the printing technique used here include screen printing, inkjet printing, gravure printing, and photolithography.

Next, the plurality of ceramic green sheets are stacked (S14: sheet stacking step). Specifically, the ceramic green sheets are stacked in the order of the base layers a to m illustrated in FIG. 2. Then, the plurality of ceramic green sheets stacked are press-bonded to form a multilayer block B1. The press apparatus used here is, for example, a die press machine.

Next, the multilayer block B1 is cut into individual pieces to form multilayer chips B2 (S15: cutting step). For example, the following technique is used to cut the multilayer block B1.

Figure 7:
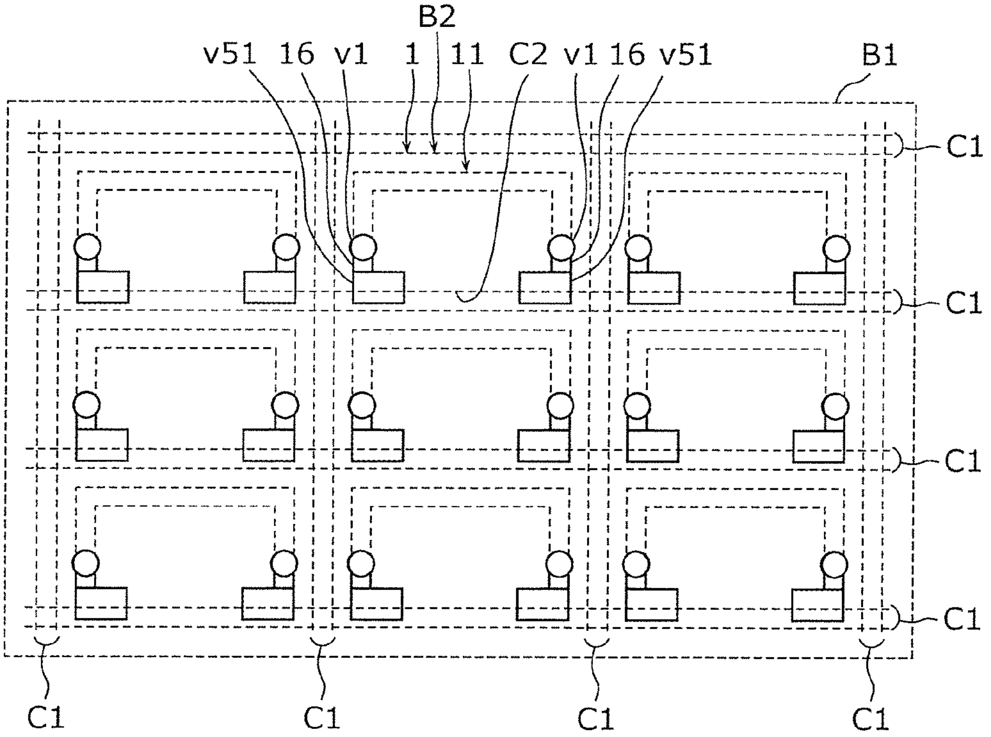
FIG. 7 is a diagram illustrating a cutting step of the manufacturing method for manufacturing the multilayer electronic component according to the first embodiment.

FIG. 7 is a diagram illustrating a cutting step of the manufacturing method for manufacturing the multilayer electronic component 1. FIG. 7 illustrates the multilayer block B1 including a plurality of multilayer chips B2 arranged in a matrix. The multilayer chips B2 illustrated in FIG. 7 are multilayer electronic components 1 yet to be sintered or separated into individual pieces. For ease of understanding, FIG. 7 shows only a surface corresponding to the base layer c of the multilayer electronic component 1.

For example, when the multilayer block B1 is cut in a grid pattern using a dicing machine, a plurality of cut-and-removed portions C1 are formed in the multilayer block B1. In the present embodiment, the cut-and-removed portions C1 are provided at positions where the interlayer conductors v51 forming the first mounting terminals 51*a* and 51*b* are partially cut away. Therefore, when the cut-and-removed portions C1 are formed by cutting, the interlayer conductors v51 are exposed on a cut surface C2. Thus, the interlayer conductors v51 forming the first mounting terminals 51*a* and 51*b* are formed in such a manner as to be embedded from the cut surface C2 into the multilayer chips B2.

Next, the multilayer chips B2 separated but yet to be sintered are fired (S16: firing step). As a firing apparatus, for example, a batch firing furnace or a belt-type firing furnace is used. In this firing operation, the ceramic powder in the ceramic green sheets is sintered and the conductive powder in the conductive paste is also sintered. The sintering of the conductive paste produces the main line 10, the secondary line 20, the first mounting terminals 51*a* and 51*b*, and the second mounting terminals 52*a* and 52*b*. The cut surface C2 formed in the cutting step serves as the mount surface 5 after the firing. The first mounting terminals 51*a* and 51*b* formed by the interlayer conductors v51 are embedded from the mount surface 5 into the element body 30 while being exposed on the mount surface 5.

Next, the plating layer 53 is formed on each of the exposed first mounting terminals 51*a* and 51*b* and second mounting terminals 52*a* and 52*b* (S17: plating step). Electrolytic plating using Ni or Sn is used as a plating technique. When an Au material is used to form the plating layer 53, electroless plating or other techniques may be used. The plating step may be omitted as appropriate. The multilayer electronic component 1 is thus made by steps S11 to S17 described above.

The manufacturing method for manufacturing the multilayer electronic component 1 according to the present embodiment is a method for manufacturing the multilayer electronic component 1 that includes the element body 30 including the plurality of base layers a to m and the mounting terminals 51 and 52. The manufacturing method includes the step of forming interlayer conductors (e.g., v51) in at least three base layers (e.g., base layers b, c, and d) of the plurality of base layers a to m, the step of forming the multilayer block B1 by stacking the plurality of base layers a to m in such a manner that the interlayer conductors v51 formed in the at least three base layers b, c, and d overlap each other, the step (cutting step) of forming the multilayer chips B2 by cutting the multilayer block B1 in the direction perpendicular to the principal surfaces of the base layers a to m, and the step (firing step) of firing the multilayer chips B2. In the cutting step, the cutting is carried out in such a manner that the interlayer conductors v51 are partially exposed on the cut surface C2, and thus the interlayer conductors v51 are embedded into the multilayer chip B2 in the direction perpendicular to the cut surface C2. In the firing step, the base layers a to m are sintered to form the element body 30, and the interlayer conductors v51 are sintered to form the mounting terminals 51 and 52 that are embedded from the cut surface C2 into the element body 30 while being exposed on the cut surface C2. With this manufacturing method, the multilayer electronic component 1 can be made which includes the mounting terminals 51 and 52 secured with a high securing strength to the element body 30.

[1-4. Summary]

The multilayer electronic component 1 according to the present embodiment is the multilayer electronic component 1 that includes the element body 30 including the plurality of base layers a to m stacked in the first direction X, the inner conductors 9 disposed in the element body 30, and the mounting terminals 51 and 52 connected to the inner conductors 9. The multilayer electronic component 1 has the mount surface 5 positioned on the mounted side when the multilayer electronic component 1 is mounted. The mount surface 5 is parallel to the axis X1 along the first direction X. The mounting terminals 51 and 52 are disposed on the mount surface 5 and embedded from the mount surface 5 into the element body 30.

As described above, the mount surface 5 is formed parallel to the axis along the first direction X, which is the stacking direction of the base layers a to m, and the mounting terminals 51 and 52 are embedded from the mount surface 5 into the element body 30. This can enhance the securing strength between the element body 30 and the mounting terminals 51 and 52. Also, for example, since the dimension of the mounting terminals 51 in the first direction X can be determined by the thickness dimension of the base layers b, c, and d, the dimensional accuracy of the mounting terminals 51 in the first direction X can be improved. This can reduce the pitches of the plurality of mounting terminals 51 and 52.

Second Embodiment

A configuration of a multilayer electronic component 1A according to a second embodiment will now be described with reference to FIG. 8 to FIG. 10C. The multilayer electronic component 1 according to the first embodiment is a surface-coupled directional coupler where the line surfaces 12 and 22 of the first line portion 11 and the second line portion 21 are coupled to each other. In contrast, the multilayer electronic component 1A according to the second embodiment is a side-edge-coupled directional coupler where edges 13 and 23 of the first line portion 11 and the second line portion 21 are coupled to each other.

Figure 8:
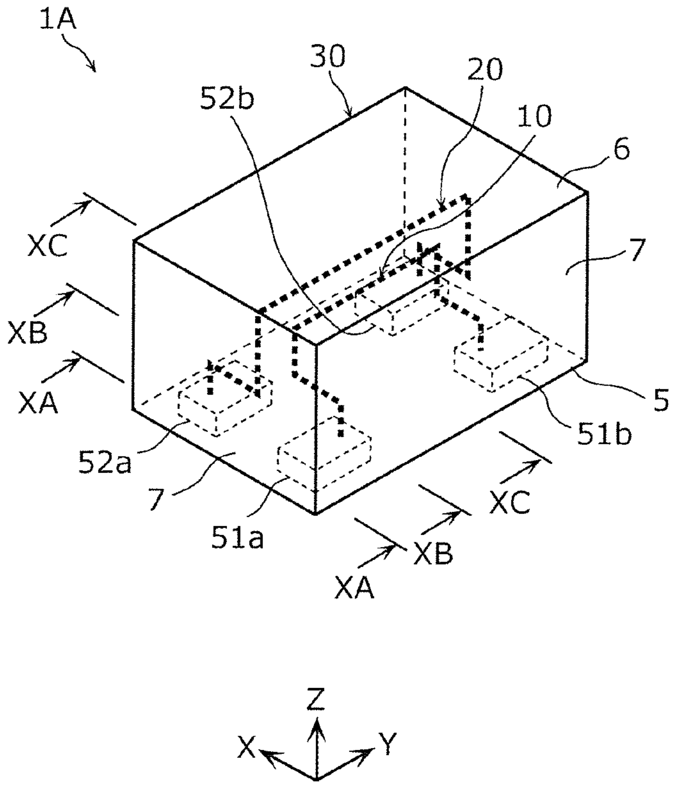
FIG. 8 is a perspective view of a multilayer electronic component according to a second embodiment.
Figure 9:
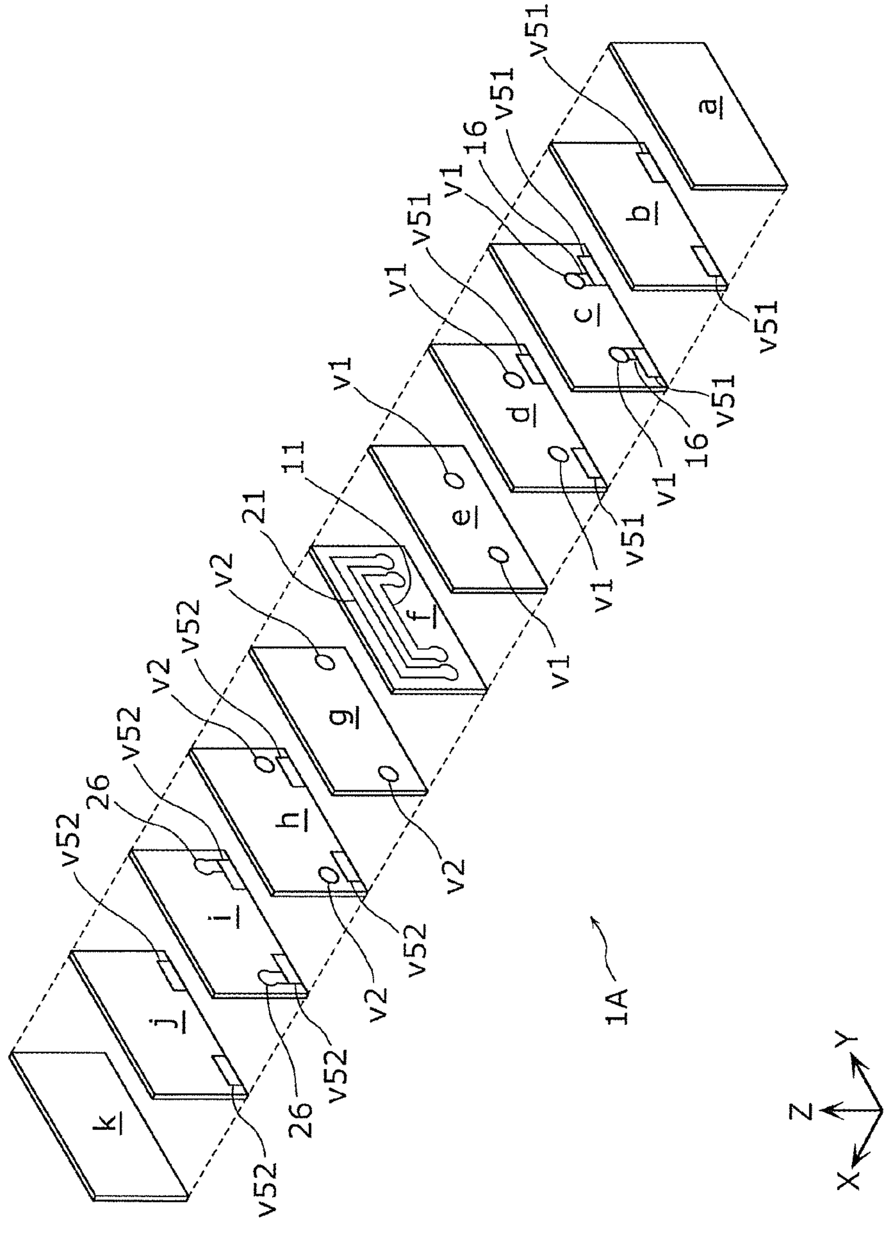
FIG. 9 is an exploded perspective view of the multilayer electronic component according to the second embodiment.
Figure 10A:
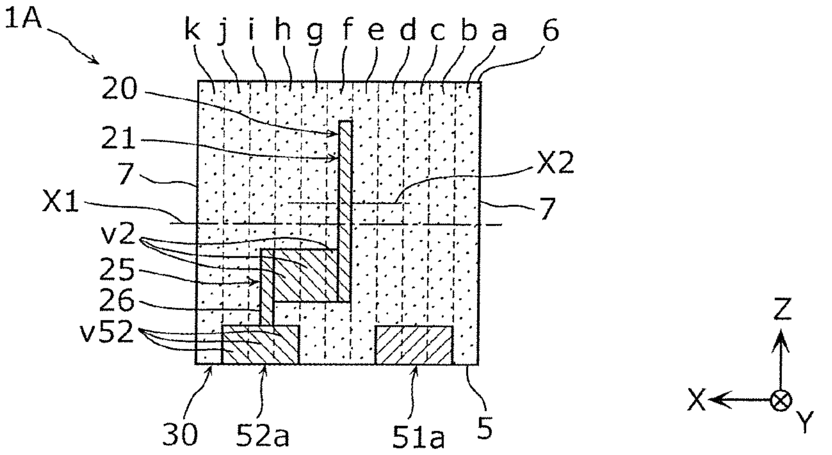
FIG. 10A is a cross-sectional view of the multilayer electronic component according to the second embodiment, taken along line XA-XA of FIG. 8.
Figure 10B:
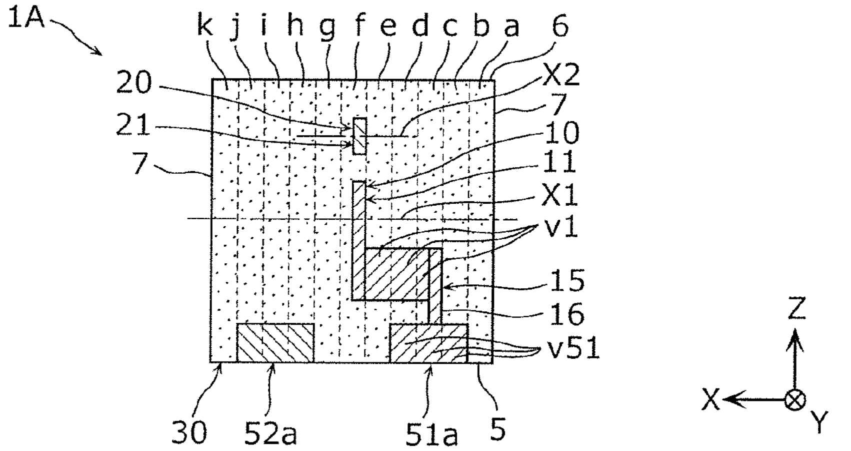
FIG. 10B is a cross-sectional view of the multilayer electronic component according to the second embodiment, taken along line XB-XB of FIG. 8.
Figure 10C:
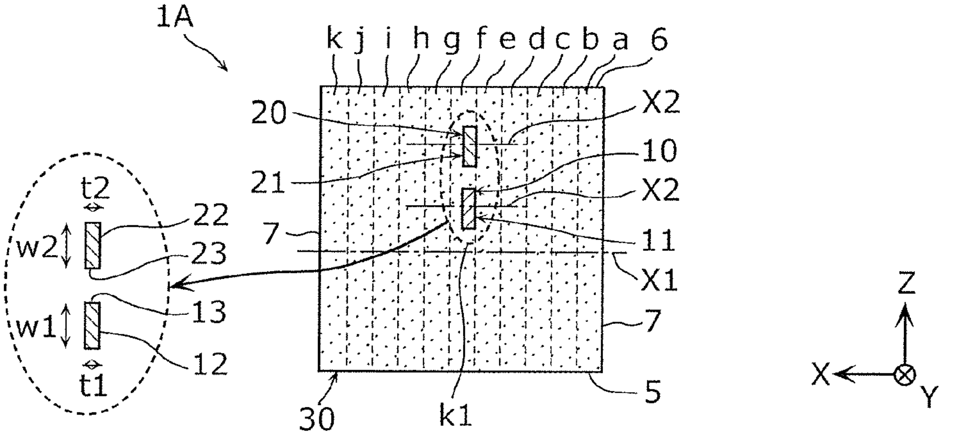
FIG. 10C is a cross-sectional view of the multilayer electronic component according to the second embodiment, taken along line XC-XC of FIG. 8.

FIG. 8 is a perspective view of the multilayer electronic component 1A according to the second embodiment. FIG. 9 is an exploded perspective view of the multilayer electronic component 1A. FIG. 10A is a cross-sectional view of the multilayer electronic component 1A taken along line XA-XA of FIG. 8. FIG. 10B is a cross-sectional view of the multilayer electronic component 1A taken along line XB-XB of FIG. 8. FIG. 10C is a cross-sectional view of the multilayer electronic component 1A taken along line XC-XC of FIG. 8.

As illustrated in FIG. 8 to FIG. 10C, the multilayer electronic component 1A includes the element body 30 having insulating properties, the two inner conductors 9 both disposed in the element body 30 and having conductive properties, the pair of first mounting terminals 51*a* and 51*b* having conductive properties, and the pair of second mounting terminals 52*a* and 52*b* having conductive properties. Of the two inner conductors 9, one inner conductor 9 is the main line 10 of the directional coupler and the other inner conductor 9 is the secondary line 20 of the directional coupler.

The multilayer electronic component 1A is rectangular parallelepiped-like in outer shape and has the mount surface 5, the top surface 6 opposite the mount surface 5, and the four side faces 7 perpendicular to both the mount surface 5 and the top surface 6. The mount surface 5 is perpendicular to the axis along the third direction Z, and is parallel to the axis X1 along the first direction X.

The element body 30 is formed, for example, by stacking the plurality of base layers a, b, c, d, e, f, g, h, i, j, and k. The base layers a and k are outermost layers, each serving as an outer coating.

The mount surface 5 has the mounting terminals 51 and 52. The first mounting terminals 51*a* and 51*b* forming a pair are connected to the respective ends of the main line 10. The second mounting terminals 52*a* and 52*b* forming a pair are connected to the respective ends of the secondary line 20.

The mounting terminals 51 and 52 are arranged in a land grid array (LGA) on the mount surface 5. The mounting terminals 51 and 52 have respective exposed surfaces exposed outward. The exposed surfaces are formed in the same plane as the mount surface 5.

The mounting terminals 51 and 52 are each rectangular parallelepiped-like in outer shape. In other words, the mounting terminals 51 and 52 are each rectangular in cross-section taken along a plane perpendicular to the mount surface 5.

The first mounting terminals 51*a* and 51*b* are each formed by stacking the interlayer conductors v51 in the three adjacent base layers b, c, and d of the plurality of base layers a to k in the stacking direction (see FIG. 9). The second mounting terminals 52*a* and 52*b* are each formed by stacking the interlayer conductors v52 in the three adjacent base layers h, i, and j in the stacking direction.

In the present embodiment, the mount surface 5 is formed parallel to the axis X1 along the first direction X, which is the stacking direction of the base layers a to k, and the mounting terminals 51 and 52 are embedded from the mount surface 5 into the element body 30 in the direction perpendicular to the mount surface 5 (third direction Z). Thus, the multilayer electronic component 1A has a structure in which the mounting terminals 51 and 52 are embedded in the element body 30, and this enhances the securing strength between the element body 30 and the mounting terminals 51 and 52.

The main line 10 and the secondary line 20, which are component elements of the directional coupler, will now be described.

The main line 10 has the first line portion 11 and the pair of extended line portions 15 connected to the respective ends of the first line portion 11 (see FIG. 10B). The extended line portions 15 are each formed by stacking the extended pattern 16 on the base layer c and the interlayer conductors v1 in the respective base layers c, d, and e in the stacking direction (see FIG. 9). The first line portion 11 is an inverted U-shaped conductor pattern formed on the base layer f.

An electric signal is transmitted to the first line portion 11 through the first mounting terminals 51*a* and 51*b* and the extended line portions 15. The line thickness t1 of the first line portion 11 is smaller in size than the line width w1 of the first line portion 11 (see FIG. 10C). The first line portion 11 is disposed in such a manner that the axis X2 along the line thickness direction does not intersect the mount surface 5. Specifically, the axis X2 along the line thickness direction of the first line portion 11 is parallel to the mount surface 5. The line thickness direction of the first line portion 11 is the same as the stacking direction of the plurality of base layers a to k. The first line portion 11 has the line surface 12 perpendicular to the line thickness direction. The line surface 12 of the first line portion 11 is perpendicular to the mount surface 5. The first line portion 11 has, at respective ends thereof in the line width direction, the edges 13 perpendicular to the line surface 12.

The secondary line 20 has the second line portion 21 and the pair of extended line portions 25 connected to the respective ends of the second line portion 21 (see FIG. 10A). The extended line portions 25 are each formed by stacking the interlayer conductors v2 in the respective base layers f, g, h, and the extended pattern 26 on the base layer i in the stacking direction (see FIG. 9). The second line portion 21 is formed on the base layer f. The conductor pattern of the second line portion 21 is larger than the conductor pattern of the first line portion 11, and is formed over a side of the conductor pattern of the first line portion 11 adjacent to the top surface 6.

The line thickness t2 of the second line portion 21 is smaller in size than the line width w2 of the second line portion 21 (see FIG. 10C). The second line portion 21 is disposed in such a manner that the axis X2 along the line thickness direction does not intersect the mount surface 5. Specifically, the axis X2 along the line thickness direction of the second line portion 21 is parallel to the mount surface 5. The line thickness direction of the second line portion 21 is the same as the stacking direction of the plurality of base layers a to k.

The second line portion 21 and the first line portion 11 are formed on the same surface of the base layer f, and arranged adjacent to each other on this same surface. The second line portion 21 has the line surface 22 perpendicular to the line thickness direction. The line surface 22 of the second line portion 21 is perpendicular to the mount surface 5. The second line portion 21 has, at respective ends thereof in the line width direction, the edges 23 perpendicular to the line surface 22. In the direction perpendicular to the mount surface 5 (third direction Z), one of the edges 23 of the second line portion 21 faces a corresponding one of the edges 13 of the first line portion 11.

The second line portion 21 having the structure described above is electromagnetically coupled to the first line portion 11. FIG. 10C illustrates the coupling region K1 (encircled with a broken line) where the first line portion 11 and the second line portion 21 are electromagnetically coupled. In the multilayer electronic component 1A, the electromagnetic coupling of the first line portion 11 and the second line portion 21 enables a signal corresponding to the electric signal transmitted to the first line portion 11, to be transmitted to the second line portion 21.

In the multilayer electronic component 1A of the second embodiment, the mounting terminals 51 and 52 are embedded in the element body 30, and this can enhance the securing strength between the element body 30 and the mounting terminals 51 and 52.

Third Embodiment

A configuration of a multilayer electronic component 1B according to a third embodiment will now be described with reference to FIG. 11 to FIG. 12. The multilayer electronic component 1B according to the third embodiment includes a plurality of side terminals 61*a*, 61*b*, 62*a*, and 62*b*.

Figure 11:
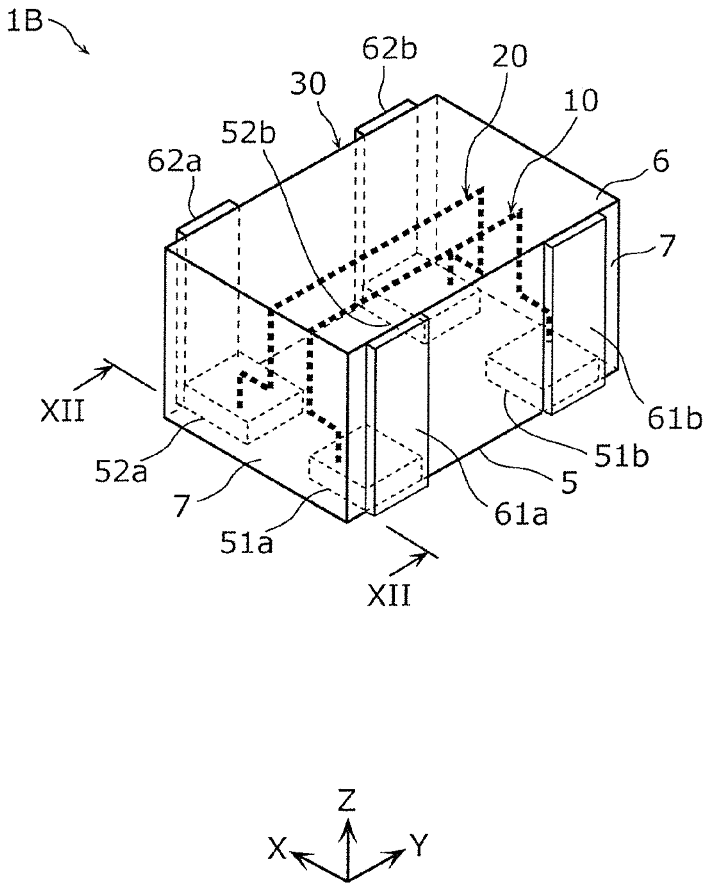
FIG. 11 is a perspective view of a multilayer electronic component according to a third embodiment.

FIG. 11 is a perspective view of the multilayer electronic component 1B according to the third embodiment. FIG. 12 is a cross-sectional view of the multilayer electronic component 1B taken along line XII-XII of FIG. 11.

Figure 12:
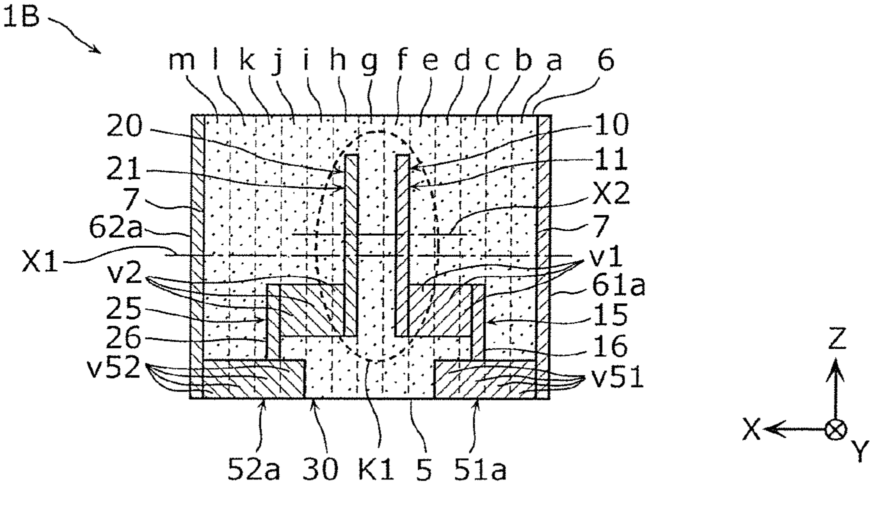
FIG. 12 is a cross-sectional view of the multilayer electronic component according to the third embodiment, taken along line XII-XII of FIG. 11.

As illustrated in FIG. 11 to FIG. 12, the side terminals 61*a* and 61*b* are disposed on one side face 7 of the element body 30 in the first direction X. The side terminal 61*a* is connected to the first mounting terminal 51*a*, with the interlayer conductor v51 in the base layer a interposed therebetween, and the side terminal 61*b* is connected to the first mounting terminal 51*b*, with the interlayer conductor v51 in the base layer a interposed therebetween.

The side terminals 62*a* and 62*b* are disposed on the other side face 7 of the element body 30 in the first direction X. The side terminal 62*a* is connected to the second mounting terminal 52*a*, with the interlayer conductor v52 in the base layer m interposed therebetween, and the side terminal 62*b* is connected to the second mounting terminal 52*b*, with the interlayer conductor v52 in the base layer m interposed therebetween.

In the multilayer electronic component 1B of the third embodiment, the mounting terminals 51 and 52 are embedded in the element body 30, and this can enhance the securing strength between the element body 30 and the mounting terminals 51 and 52. The multilayer electronic component 1B includes the side terminals 61*a* to 62*b* as described above. Therefore, when, for example, the multilayer electronic component 1B is mounted on the mount substrate 80, the side terminals 61*a* to 62*b* can be used to solder the multilayer electronic component 1B to the mount substrate 80. This can improve the connection strength between the multilayer electronic component 1B and the mount substrate 80.

Fourth Embodiment

Figure 13:
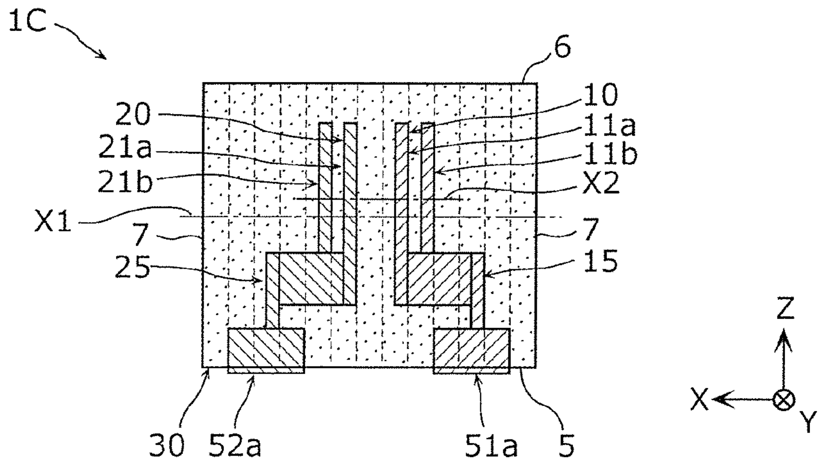
FIG. 13 is a cross-sectional view of a multilayer electronic component according to a fourth embodiment.

FIG. 13 is a cross-sectional view of a multilayer electronic component 1C according to a fourth embodiment. The multilayer electronic component 1C is, for example, an inductor, and the first line portion 11 and the second line portion 21, each have a multilayer structure, instead of a single layer structure.

Specifically, the first line portion 11 is composed of a line portion 11*a* (first layer) formed on the base layer f, a line portion 11*b* (second layer) formed on the base layer e, and an interlayer conductor (not shown) connecting the line portion 11*a* and the line portion 11*b*. The first line portion 11 is a coil-like portion having 7/4 turns. Similarly, the second line portion 21 is composed of a line portion 21*a* (first layer) formed on the base layer h, a line portion 21*b* (second layer) formed on the base layer i, and an interlayer conductor (not shown) connecting the line portion 21*a* and the line portion 21*b*. The second line portion 21 is a coil-like portion having 7/4 turns. Thus, in the multilayer electronic component 1C, the first line portion 11 and the second line portion 21 have more turns and this increases the degree of coupling between the first line portion 11 and the second line portion 21.

In the multilayer electronic component 1C of the fourth embodiment, the mounting terminals 51 and 52 are embedded from the mount surface 5 into the element body 30, and this can enhance the securing strength between the element body 30 and the mounting terminals 51 and 52.

OTHER EMBODIMENTS

Although the multilayer electronic components according to the first, second, third, and fourth embodiments of the present disclosure have been described, the present disclosure is not limited to the first to fourth embodiments described above. Any embodiments obtained by making various changes conceived by those skilled in the art to the first to fourth embodiments, and any embodiments obtained by combining component elements of different embodiments, may be included in the scope of one or more embodiments of the present disclosure, as long as they do not depart from the spirit of the present disclosure.

The element body 30 of the multilayer electronic component 1 according to the first embodiment may include one or more base layers different from the plurality of base layers a to m described above. For example, the first mounting terminals 51*a* and 51*b* may each be formed by stacking the interlayer conductors v51 in four or more adjacent base layers, and the second mounting terminals 52*a* and 52*b* may each be formed by stacking the interlayer conductors v52 in four or more adjacent base layers.

Although the main line 10 of the multilayer electronic component 1 according to the first embodiment is composed of the first line portion 11 and the extended line portions 15, the main line 10 does not necessarily need to include the extended line portions 15. That is, the first line portion 11 may be extended at both ends thereof toward the mount surface 5 and connected to the first mounting terminals 51*a* and 51*b*. Similarly, although the secondary line 20 of the multilayer electronic component 1 is composed of the second line portion 21 and the extended line portions 25, the secondary line 20 does not necessarily need to include the extended line portions 25. That is, the second line portion 21 may be extended at both ends thereof toward the mount surface 5 and connected to the second mounting terminals 52*a* and 52*b*.

The mounting terminals 51 and 52 may be hexahedral in shape. For example, when the mounting terminals 51 and 52 are cut perpendicular to the mount surface 5, they may be parallelogrammatic in cross-section.

Figure 14:
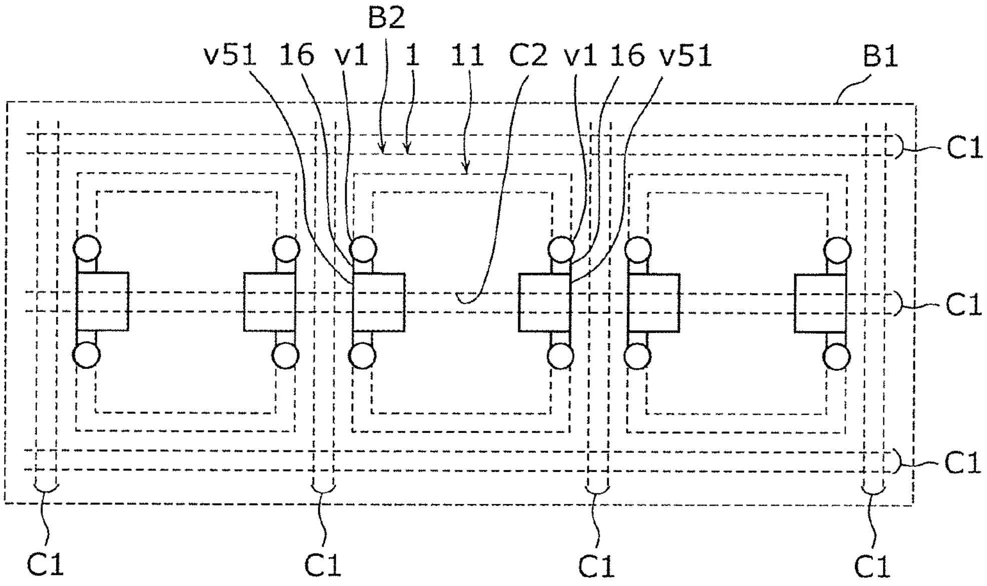
FIG. 14 is a diagram illustrating another example of the cutting step illustrated in FIG. 7.

In the cutting step of the manufacturing method for manufacturing the multilayer electronic component 1 according to the first embodiment, the interlayer conductors v51 may be cut, for example, using a dicing machine. In this case, as illustrated in FIG. 14, for example, conductor patterns to be cut may be formed symmetrically with respect to a cutting blade.

INDUSTRIAL APPLICABILITY

As a multilayer electronic component in which an element body and a mounting terminal are secured with a high securing strength, any of the multilayer electronic components according to the present disclosure can be widely used, for example, as a component mounted in a radio-frequency module.

REFERENCE SIGNS LIST

1, 1A, 1B, 1C: multilayer electronic component
5: mount surface
6: top surface
7: side face
9: inner conductor
10: main line
11: first line portion
12: line surface
13: edge
15: extended line portion
16: extended pattern
20: secondary line
21: second line portion
22: line surface
23: edge
25: extended line portion
26: extended pattern
30: element body
51, 52: mounting terminal
51*a*, 51*b*: first mounting terminal
52*a*, 52*b*: second mounting terminal
53: plating layer
61*a*, 61*b*, 62*a*, 62*b*: side terminal
80: mount substrate
80*a*: principal surface
82*a*, 82*b*, 82*c*: substrate electrode
100: radio-frequency module
a, b, c, d, e, f, g, h, i, j, k, 1, m: base layer
B1: multilayer block
B2: multilayer chip
C1: cut-and-removed portion
C2: cut surface
K1: coupling region
t1, t2: thickness
v1, v2, v51, v52: interlayer conductor
X: first direction
X1: axis along first direction
X2: axis along line thickness direction
w1, w2: line width

The invention claimed is:

1. A multilayer electronic component comprising:

an element body including a plurality of base layers stacked in a first direction;

an inner conductor disposed in the element body; and a mounting terminal connected to the inner conductor, wherein the multilayer electronic component has a mount surface positioned on a mounted side when the multilayer electronic component is mounted;

the mount surface is disposed so as not to intersect an axis along the first direction;

the mounting terminal is disposed on the mount surface and embedded from the mount surface into the element body such that the mount surface circumscribes the mounting terminal, and the mounting terminal is formed by stacking a plurality of interlayer conductors.

2. The multilayer electronic component according to claim 1, wherein the mount surface is parallel to the axis along the first direction.

3. The multilayer electronic component according to claim 1, wherein the mounting terminal is embedded in a direction perpendicular to the mount surface.

4. The multilayer electronic component according to claim 1, wherein the mounting terminal is exposed from the element body.

5. The multilayer electronic component according to claim 1, wherein the mounting terminal comprises interlayer conductors disposed in respective at least three adjacent ones of the plurality of base layers.

6. The multilayer electronic component according to claim 1, wherein the mounting terminal is in the shape of a rectangular parallelepiped.

7. The multilayer electronic component according to claim 1, wherein the multilayer electronic component is in the shape of a rectangular parallelepiped and includes a plurality of mounting terminals; and the plurality of mounting terminals are disposed on the same mount surface.

8. The multilayer electronic component according to claim 1, wherein the multilayer electronic component is in the shape of a rectangular parallelepiped and has a side face perpendicular to the mount surface, the multilayer electronic component further comprising a side terminal disposed on the side face and connected to the mounting terminal.

9. The multilayer electronic component according to claim 2, wherein the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

10. The multilayer electronic component according to claim 3, wherein the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

11. The multilayer electronic component according to claim 4, wherein the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

12. The multilayer electronic component according to claim 5, wherein the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

13. The multilayer electronic component according to claim 6, wherein the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

14. The multilayer electronic component according to claim 7, wherein the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

15. The multilayer electronic component according to claim 8, wherein the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

16. The multilayer electronic component according to claim 1, wherein the mounting terminal has an exposed surface that is exposed from the element body and circumscribed by the mount surface; and the mount surface and exposed surface are coplanar.

17. The multilayer electronic component according to claim 1, wherein the mounting terminal is not disposed at a corner of the multilayer electronic component.

18. The multilayer electronic component according to claim 1, wherein the mounting terminal is partially tapered.

19. A multilayer electronic component comprising:

an element body including a plurality of base layers stacked in a first direction;

an inner conductor disposed in the element body; and a mounting terminal connected to the inner conductor, wherein the multilayer electronic component has a mount surface positioned on a mounted side when the multilayer electronic component is mounted;

the mount surface is disposed so as not to intersect an axis along the first direction;

the mounting terminal is disposed on the mount surface and embedded from the mount surface into the element body;

the multilayer electronic component is a directional coupler;

the inner conductor includes a main line and a secondary line; and the mounting terminal includes a pair of first mounting terminals connected to respective ends of the main line, and a pair of second mounting terminals connected to respective ends of the secondary line.

* * * * *